United States Patent [19]

Intichar

[11] Patent Number: 4,879,622
[45] Date of Patent: Nov. 7, 1989

[54] CIRCUIT FOR MONITORING A SUPERCONDUCTING MAGNET WINDING

[75] Inventor: Lutz Intichar, Erlangen, Fed. Rep. of Germany

[73] Assignee: Siemens Aktiengesellschaft, Berlin and Munich, Fed. Rep. of Germany

[21] Appl. No.: 52,656

[22] Filed: May 20, 1987

Related U.S. Application Data

[63] Continuation of Ser. No. 716,018, Mar. 26, 1985, abandoned.

[30] Foreign Application Priority Data

Apr. 6, 1984 [DE] Fed. Rep. of Germany ....... 3413127

[51] Int. Cl.$^4$ .............................................. H02H 7/00
[52] U.S. Cl. ...................................... 361/19; 361/58; 361/86; 361/113; 361/141; 307/306; 307/491
[58] Field of Search ................... 361/19, 113, 86, 141, 361/146, 159; 307/56, 58, 491, 306, 249; 324/225, 71.6, 319

[56] References Cited

U.S. PATENT DOCUMENTS 4,271,443 6/1981 Nöther ................................. 361/19

OTHER PUBLICATIONS

Bischolf et al., ICEM 1984, "Considerations About the Electrical Supervision of teh Superconducting Field Winding of a 320 kVA Synchronous Generator", 1984.

*Primary Examiner*—Todd E. DeBoer
*Attorney, Agent, or Firm*—Mark H. Jay

[57] ABSTRACT

The circuit monitors the superconducting state of a superconducting magnet winding. The winding is subdivided into two serially connected sub-windings with an intermediate tap point. The end of the sub-windings are connected via an electrically conducting parallel branch. This parallel branch consists of two serially connected sub-branches, each containing at least one ohmic resistor. There is a junction between the sub-branches. This junction and the tap point of the magnet winding are the diagonal points of a bridge circuit, to which is connected an electronic device for evaluating and processing the voltage signal to be measured. To account for the ohmic resistances associated with the sub-windings of the superconducting magnet winding and thereby increasing the sensitivity of the circuit, each sub-branch of parallel branch contains at least one capacitor.

3 Claims, 2 Drawing Sheets

CIRCUIT FOR MONITORING A SUPERCONDUCTING MAGNET WINDING

This is a continuation of application Ser. No. 716,018 filed Mar. 26, 1985, now abandoned.

BACKGROUND OF THE INVENTION

The invention relates to a circuit for monitoring the conductive state of a superconducting magnet winding. The winding is of a type which is subdivided into two series-connected sub-windings with an intermediate tap point. The ends of the sub-windings are connected via an electrically conducting parallel branch. This consists of two series-connected sub-branches, each containing a resistor of predetermined value. A junction connects the sub-branches, and this junction, together with the tap point, form the diagonal points of a bridge circuit, to which is connected an electronic device for evaluating and processing the voltage signal to be measured between these points. Such an arrangement is known from DE-OS No. 28 39 787.

Superconducting magnet windings, particularly those with a relatively high power rating, are endangered in case of an unintended transition from the superconducting operating state to the normally conducting state, even if this transition ("quenching") occurs only in a portion of the winding. In fact, due to the low heat capacity of the superconducting winding conductors, the conductor will, after such a transition, quickly heat up due to the associated increase in resistance. The conductor's specific resistance also increases rapidly, whereby the temperature rise is further acceleraed. Stray voltages also arise, presenting a strain on the insulation of the winding.

To protect relatively large superconducting magnet windings against damage or destruction by overheating or arcing, special protective measures are necessary. These measures have consisted, for example, in subdividing the magnet winding into several partial windings which for voltage limitation are bridged with protective resistors (cf. DE-OS No. 23 01 152), semiconductor diodes (cf. DE-AS No. 16 14 964) or overvoltage arresters (cf. DE-OS No. 17 64 369).

Besides these passive protective measures, active elements (particularly so-called "quench detectors") are also required. These make it possible to rapidly disconnect the superconducting magnet winding from an external energy supply in the event of quenching, particularly during the exciting phase. Such quench detectors are generally used to monitor the voltage drop across the superconducting magnet winding, which drop not only contains the ohmic voltage drop across the winding, but also the inductive signal $L \times di/dt$ as well as voltage signal, smaller by several factors of ten, from the remagnetization (magnetic reversal), losses of the superconductors themselves. In the simplest case only the total voltage is compared with a given maximum value. The smallest detectable ohmic signal is on the same order of magnitude of the inductive signal.

In improved monitoring circuits, the inductive signal is taken into account; the smallest detectable ohmic signal is in this case on the same order of magnitude as the signal determined by the remagnetization or magnetic reversal, losses. Still better circuits also take this signal into account. A quench detector of this kind has been described in detail in the above mentioned DE-OS No. 28 39 787.

This invention is designed for use with a superconducting magnet winding which is subdivided into two sub-windings by a center tap. Where such sub-windings consist of two symmetrically constructed halves, monitoring can be accomplished by analog comparison of the voltages across the two winding halves, in that the two sub-windings together with at least two external resistors form a bridge.

In such winding configurations, however, the ohmic resistances of e.g. solder points in the superconducting magnet winding cannot be accounted for. This limits the resolution or sensitivity of the circuit. To minimize the ohmic resistances, it is desirable to couple the external resistors of the bridge directly to the ends of the winding, but this is not always possible for reasons of space.

One object of the present invention is to increase the sensitivity of the initially mentioned circuit with respect to the detection of changes at resistances and/or inductances.

Another object is to account for the ohmic resistances of the sub-windings of the superconducting magnet winding. Still another object is, in general, to improve on the prior art.

SUMMARY OF THE INVENTION

According to the invention, each sub-branch of each parallel branch contains at least one capacitor. The capacitors may be parallel to, or in series with, their respective resistors. The value of the resistors and capacitors are chosen such that, together with the ohmic and inductive resistors of the respective magnetic winding, there is no voltage drop across the diagonal points of the bridge circuit during superconducting operation. By integrating capacitors into the bridge circuit in accordance with the invention, the ohmic resistances of the winding can be taken into account. Thus, direct connection of the external resistors or capacitors of the bridge to the ends of the winding is no longer necessary. The invention can be adjusted much more sensitively than known circuits.

It is especially advantageous to provide the ohmic resistor of each sub-branch with a tap, and to interconnect these resistor taps through a circuit containing at least one resistor and at least one capacitor. It is then possible to detect in a sensitive manner the occurrence of a resistance-affected quenched zone in the magnet winding even when the magnet winding is magnetically coupled with at least one shortcircuit loop, as such coupling generally leads to an asymmetry between the two winding halves or sub-windings. The shortcircuit loops may involve electrically conductive materials in which eddy currents are induced, or discrete conductor loops with internal and/or external fixed resistors.

The invention will be better understood with reference to the following drawings and the detailed description of preferred embodiments.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figures 1, 2:
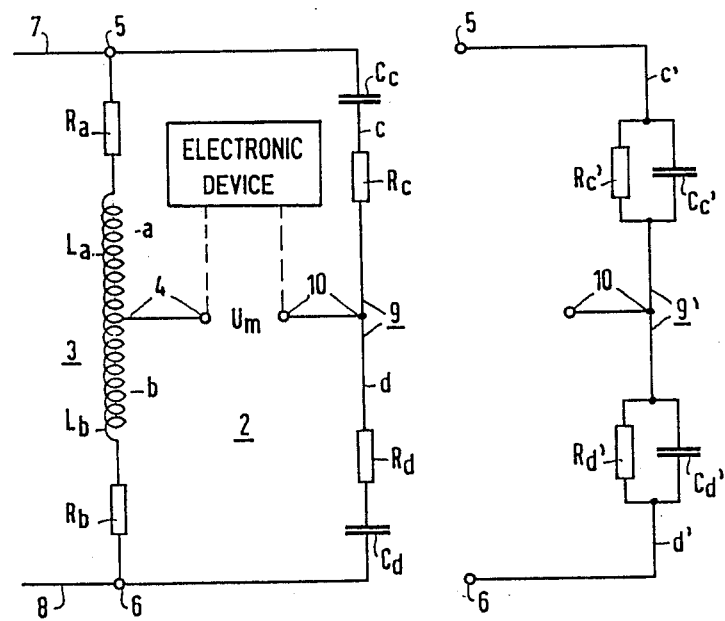
FIG. 1 shows a first preferred embodiment of the invention.
FIG. 2 shows a part of a second preferred embodiment of the invention.

Throughout the various figures, the same part is always identified with the same reference numeral.

FIG. 1 proceeds from a known circuit arrangement (see FIG. 1 of DE-OS No. 28 39 787), and represents a bridge circuit 2, including a superconducting magnet winding 3 to be monitored. This winding 3 has a center tap 4, by which the winding 3 is subdivided into two approximately symmetrical sub-windings a and b of equal size, with inductances $L_a$ and $L_b$ respectively. The ohmic resistors to be associated with the sub-windings a and b in the superconducting operating state are marked $R_a$, $R_b$. At the ends 5, 6 of these sub-windings, as the magnet winding 3 is disconnectably connected, via lines 7 and 8, with an external current supply (not shown). Another branch generally indicated by reference numeral 9 of the bridge circuit 2 is connected at the ends 5 and 6, in parallel with the magnet winding 3. This parallel branch 9 is subdivided by a central junction 10 into two sub-branches c, d. Each of these sub-branches c, d contains a series connection of a resistor $R_c$, $R_d$ and a capacitor $C_c$, $C_d$ respectively. Connected to the tap 4 of the magnet winding 3 and to the junction 10 in the parallel branch 9 is a device (not shown) for the evaluation and processing of the voltage signal $U_m$ to be measured between these points, to be able, in case of e.g. a quench, to cut off the external current supply rapidly and if necessary to initiate additional active protective measures. Respectve evaluation and further processing installations are generally known (compare with DE-OS No. 28 39 787, especially FIG. 1). In the initial state of circuit 2 i.e. in the superconducting operating state of magnet winding 3, the resistors and capacitors are matched so that the voltage $U_m$ between tap 4 and junction 10 is zero or almost zero. This condition is fulfilled for every current with any desired time form if the following relations are maintained:

$$\tau \times R_c = L_a; \quad \tau = R_a \times C_c,$$
$$\text{and}$$
$$\tau \times R_d = L_b; \quad \tau = R_b \times C_d.$$

Herein $\tau$ is a freely selectable scale-time constant. It makes it possible to place the resonance frequencies $(2\pi\sqrt{L \cdot c})^{-1}$ for the various combinations of L and C outside any excitation frequencies. The attenuation in the loop is proportional to $\tau^{-1}$, suggesting small values of $\tau$. On the other hand, the input resistance of the $U_m$-detecting evaluating device must be chosen high in comparison to $R_c$ and $R_d$.

As can readily be derived from the above conditions, by insertion of the capacitors $C_c$ and $C_d$ into the parallel branch 9 it becomes possible advantageously to take into consideration the ohmic resistors $R_a$ and $R_b$ of the magnet winding 3 and thus to obtain a corresponding sensitivity of the bridge circuit 2 when it is detuned due to a quench.

Instead of the series connection of R-C elements illustrated in FIG. 1, a parallel connection of capacitors and resistors is possible. Accordingly, as in the basic circuit diagram of FIG. 2, a parallel branch 9' of the network of two sub-branches c' and d' connected to the magnet winding at the ends 5 and 6 thereof is formed, which partial branches consist of a resistor $R_c'$, $R_d'$ and a parallel-connected capacitor $C_c'$, $C_d'$ respectively. When using this network in a bridge circuit according to FIG. 1, the voltage signal $U_m$ between the diagonal points 4 and 10 of the bridge circuit is zero when the following conditions are fulfilled:

$$r^2 C_d' = L_a; \quad r^2 = R_a \times R_d'$$
$$r^2 C_c' = L_b; \quad r^2 = R_b \times R_c'$$

Here r is a freely selectable scale resistance, which is determined according to similar consideration as the time constant $\tau$ according to FIG. 1.

Figure 3:
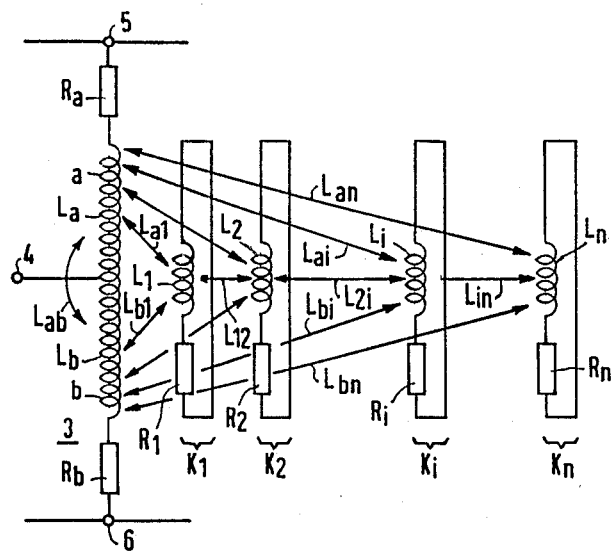
FIG. 3 illustrates an equivalent circuit for a superconducting magnet winding with coupled shortcircuit loops.

For the networks shown in FIGS. 1 and 2, it has been assumed that only the inductances of the winding 3 itself need be taken into consideration. Often, however, there are formed in the magnet winding 3 additional shortcircuit loops of electrically conducting parts, which have inherent (internal) inductances and resistances. A corresponding equivalent circuit diagram is shown in FIG. 3. According to it, the super-conducting magnet winding 3 of FIG. 1 with the inductances $L_a$ and $L_b$ of its at first symmetrical sub-windings a and b as well as with the partial winding resistors $R_a$ and $R_b$ is coupled magnetically with a plurality n of shortcircuit loops $K_1$ to $K_n$. The number n depends on the required sensitivity of the circuit for monitoring the respective magnetic winding. The configuration of the magnetic winding must be considered when selecting the magnitude for the sensitivity level, that is whether eddy currents generated by e.g. steel plates or aluminum rings have to be considered. These short-circuit loops, each comprising an inductance $L_1$ to $L_n$ and an ohmic resistance $R_1$ to $R_n$, therefore lead to coupling inductance with the partial windings and also with one another. Some—not all—of these inductances are indicated by arrows $L_{a1}$ to $L_{an}$, $L_{b1}$ to $L_{bn}$ and $L_{12}$ to $L_{in}$, respectively (with $1 \leq i \leq n-1$). These coupling inductances generally lead to an asymmetry of the two winding halves a and b, so that in case of excitation changes in the circuits of FIGS. 1 and 2 voltage signals are produced which reduce the resolution for a resistance in the winding itself.

Figure 4:
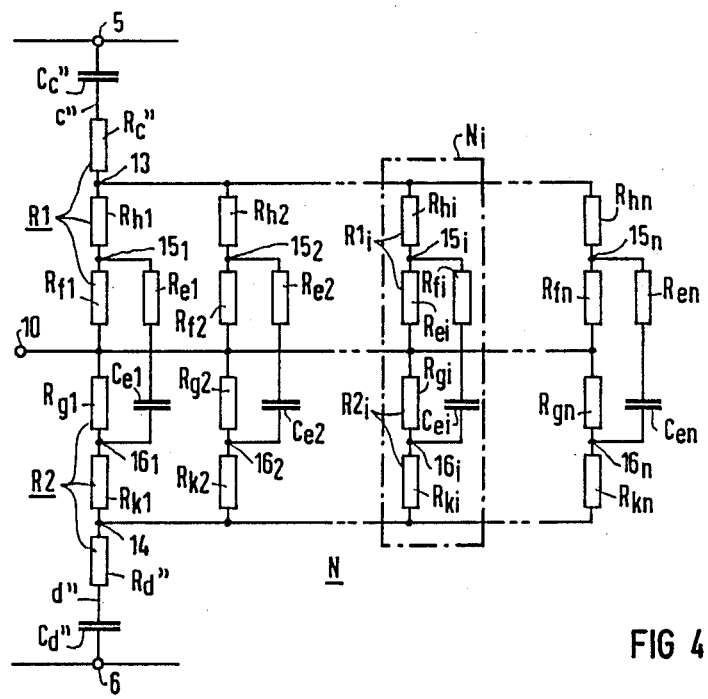
FIG. 4 shows a third preferred embodiment of the invention.
Figure 5:
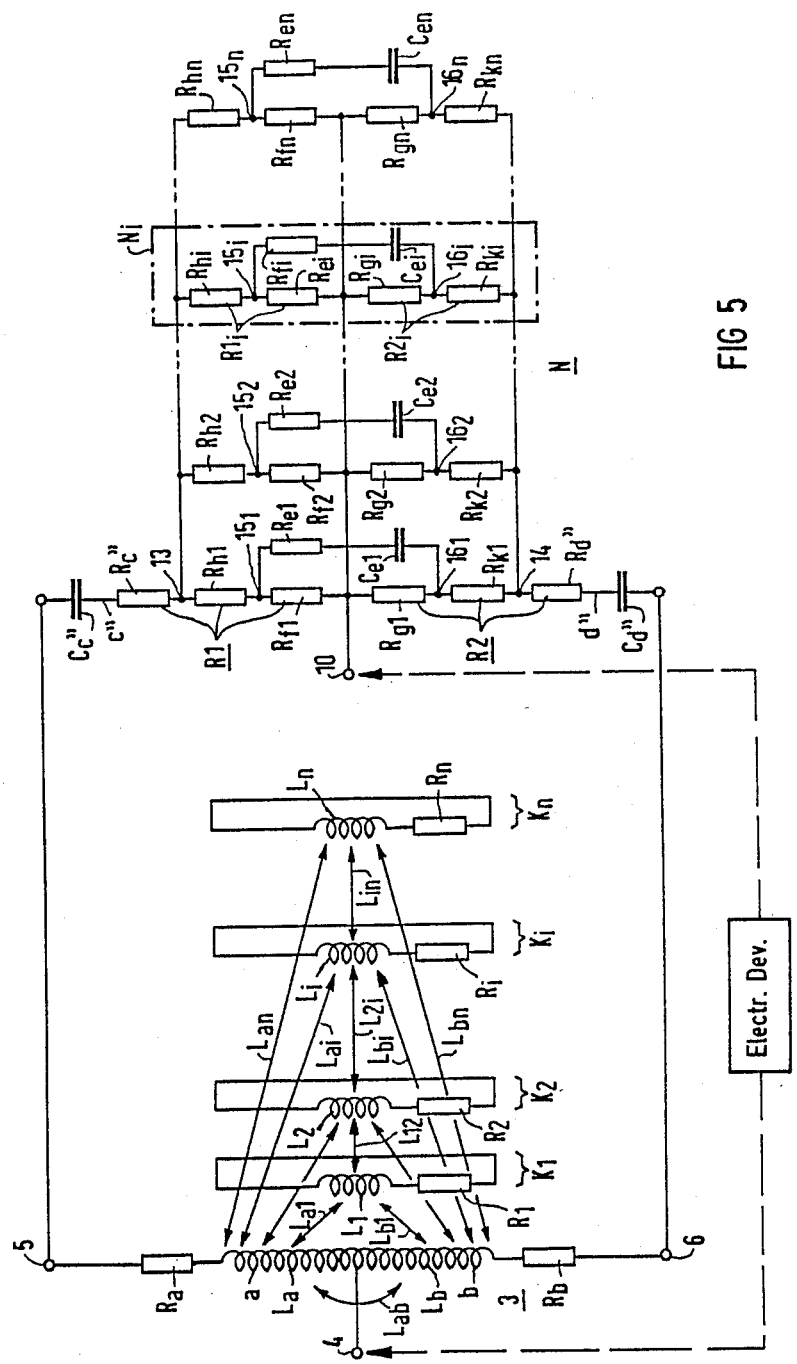

To take this effect of the shortcircuit loops into account, the parallel branch of the bridge circuit of FIG. 1 is advantageously developed to form a network such as that sown in FIG. 4. This network N differs from the network of the parallel branch 9 of FIG. 1 in that, apart from the different sizes of the capacitors $C_c''$ and $C_d''$ and of the resistors $R_c''$ and $R_d''$ in the partial branches c'', d'', these resistors are not connected directly with the junction 10. Rather between their corresponding free ends 13, 14 there are a predetermined number n of such sub-networks $N_1$ to $N_n$ connected in parallel. This number n corresponds to the number of shortcircuit loops $K_n$ of FIG. 3 taken into consideration.

The $i^{th}$ sub-network $N_i$, outlined in the FIG. 4 by a dash-dot line will be considered. The index i runs from 1 to n for the entire network N. The $i^{th}$ sub-network contains between the free end 13 of resistor $R_c''$ and junction 10 two serially connected resistors $R_{hi}$ and $R_{fi}$. Analogously two resistors $R_{ki}$ and $R_{gi}$ are connected between end 14 and junction 10. Each each of the resistor pairs $R_{hi}$-$R_{fi}$ and $R_{ki}$-$R_{gi}$ a junction 15i, 16i is formed. These junctions are further interconnected via an R-C element with a serial connection of a resistor $R_{ei}$ and a capacitor $C_{ei}$.

Considering for example the sub-network $N_1$ in the total network N, the serially connected resistors $R_c''$-$R_{h1}$-$R_{f1}$ can, for example, be regarded as a common resistor R1, which is provided with two taps formed by the free end 13 of resistor $R_c''$ and by the junction $15_1$. The same applies to the resistor chain $R_d''$-$R_{k1}$-$R_{g1}$ with taps 14 and $16_1$. Further also for the sub-network $N_i$ alone the serially connected resistors $R_{hi}$ and $R_{fi}$ as well as the resistors $R_{ki}$ and $R_{gi}$ may be replaced by a resistor $R1_i$ or $R2_i$ with taps $15_i$, $16_i$.

The network N connected to the superconducting magnet winding is composed, therefore, of a series of capacitors and resistors which are so arranged and matched (tuned) that for a given state of inductances and resistances in the magnet winding and all coupled shortcircuit loops the measured signal is zero or close to zero, regardless of the current in the magnet winding or of the rate (speed) of exciting the magnet winding. Only a change in the conductive state of the magnet winding, for example due to a quenched zone in the winding, will then produce a nonzero signal. Networks should be selected as a function of the respective configuration of the super-conductive magnetic winding. For that purpose, the concrete values of the inductances and resistors indicated in FIG. 3 should be tested on an experimental basis according to known methods. For example a predetermined unit voltage pulse can be connected to both ends 5 and 6 or to one of these ends and the center tap 4 of the winding. The resulting current plots can then be included in a diagram. The analysis of the plot will provide the number of required branches of the network as well as the resistors and inductances for the replacement circuit diagram.

In addition to the described experimental determination of the characteristic values of the magnetic winding from the current plots, which result when unit voltage pulses are connected at points 4 to 6, other known methods can be applied. The stated values can also be derived from the frequency responses of current-location-plots, which result when sine-shaped ac voltages with various frequencies are connected to points 4 to 6. A corresponding method is described in: *CONSIDERATIONS ABOUT THE ELECTRICAL SUPERVISION OF THE SUPERCONDUCTING FIELD WINDING OF A 320 kVA SYNCHRONOUS GENERATOR*, H. Bischof, et al. (1984). The network for the two free sub-branches of the bridge circuit are arranged to provide the same number of parallel branches as shown in the replacement circuit diagram for the magnetic winding.

Under a nulled bridge condition, i.e. a substantially zero-voltage condition between points 4 and 10 during superconducting operation, an equation system of corresponding order can be established according to generally known computations for electrical networks. Subsequently, the individual values for the capacitors and resistors can be computed from this system of equations. To this end, the equation system resulting from the individual voltages and currents of the network is used as a basis for computation. In case of higher order, this equation system can be applied in Laplace transformed form.

In the network N illustrated in FIG. 4, the capacitors are than connected in series with a resistor according to FIG. 1. If desired, however, a parallel connection, instead of such a series connection, of resistors and capacitors according to FIG. 2 may be provided. In addition, the network shown may, according to the known techniques of electric networks, be modified to a network analogous in its function, being, for example, optimized to minimize the number of separate parts.

Those skilled in the art will understand that changes can be made in the preferred embodiments here described, and that these embodiments can be used for other purposes. Such changes and uses are within the scope of the invention, which is limited only by the claims which follow.

What is claimed is:

1. An improvement to a quench detection circuit which is connected to a superconducting magnet and which includes an electronic device,
   the magnet being of a type which includes two series-connected sub-windings connected together at an intermediate tap point,
   the circuit being connected across the magnet and to the sub-windings and including two series-connected sub-branches connected together at a junction point, each of the sub-branches including a resistor and the sub-branches being connected in a manner that the tap and junction points form diagonal points of a bridge circuit,
   and said electronic device being connected to said diagonal points,
   the improvement comprising two capacitors, each connected in a corresponding one of the sub-branches.

2. The improvement of claim 1, wherein the magnet is magnetically coupled with at least one shortcircuit loop and each of the sub-branches has a tapped resistive section, the taps of the resistive sections being connected together by a network which includes at least a resistor and at least a capacitor.

3. The improvement of claim 2, wherein the magnet is magnetically coupled with at least two shortcircuit loops and each of the tapped resistive sections has a second tap, the second taps being connected together by a sub-network.

* * * * *